United States Patent [19]
Sano et al.

[11] Patent Number: 6,030,852
[45] Date of Patent: Feb. 29, 2000

[54] SOLID-STATE IMAGING DEVICE AND METHOD OF MANUFACTURING THE SAME

[75] Inventors: Yoshikazu Sano, Osaka; Yoko Shigeta, Nara; Hiromitsu Aoki, Osaka, all of Japan

[73] Assignee: Matsushita Electronics Corporation, Osaka, Japan

[21] Appl. No.: 08/764,449

[22] Filed: Dec. 12, 1996

Related U.S. Application Data

[62] Division of application No. 08/522,131, Aug. 31, 1995, Pat. No. 5,796,154.

[30] Foreign Application Priority Data

May 22, 1995 [JP] Japan .................................. 7-122866

[51] Int. Cl.⁷ .................................................. H01L 21/77
[52] U.S. Cl. .................................. 438/69; 438/60; 438/70
[58] Field of Search .............................. 438/69, 70, 75, 438/60, 16, 71, 57

[56] References Cited

U.S. PATENT DOCUMENTS

| | | | |
|---|---|---|---|
| 5,132,251 | 7/1992 | Kim et al. | 438/70 |
| 5,172,206 | 12/1992 | Iizuka | 257/435 |
| 5,238,856 | 8/1993 | Tokumitso | 438/69 |
| 5,266,501 | 11/1993 | Ima | 438/60 |
| 5,371,397 | 12/1994 | Maegawa et al. | 257/432 |
| 5,479,049 | 12/1995 | Aoki et al. | 257/435 |
| 5,514,888 | 5/1996 | Sano et al. | 438/60 |
| 5,583,354 | 12/1996 | Ishibe | 257/432 |
| 5,593,913 | 1/1997 | Aoki | 438/69 |
| 5,595,930 | 1/1997 | Baek | 438/69 |
| 5,670,384 | 9/1997 | Needham | 438/69 |
| 5,672,519 | 9/1997 | Sona et al. | 438/69 |
| 5,679,597 | 10/1997 | Moon | 438/60 |
| 5,766,980 | 6/1998 | Ohtagaki et al. | 438/35 |
| 5,877,040 | 3/1999 | Park et al. | 438/70 |

FOREIGN PATENT DOCUMENTS

| | | |
|---|---|---|
| 0 444 212 | 9/1989 | European Pat. Off. . |
| 0 441 594 | 8/1991 | European Pat. Off. . |
| 0 502 340 | 9/1992 | European Pat. Off. . |
| 0 542 581 | 5/1993 | European Pat. Off. . |
| 1-213080 | 8/1989 | Japan . |
| 4-115678 | 4/1992 | Japan . |
| 4-348565 | 12/1992 | Japan . |
| 5-134111 | 5/1993 | Japan . |

*Primary Examiner*—Savitri Mulpuri
*Attorney, Agent, or Firm*—Merchant & Gould, P.C.

[57] ABSTRACT

When light enters a solid-state imaging device obliquely, the light passing an optical path which misses a photodiode part is gathered by a second microlens located in the lower part which directs the light more vertically. A convergent rate of the oblique incident light can be prevented from decreasing. In this way, a solid-state imaging device having high sensitivity ratio, less smear (stray light), and excellent image characteristics can be provided. A metal with a high melting point or a metal silicide film thereof is used as a photo-shielding film. After making the photo-shielding film thinner, a Boro-Phospho-Silicate-Glass (BPSG) film is provided on the entire surface. Then, the second microlens is directly formed on an element provided with a surface protective coating comprising $SiO_2$, SiON, or SiN, and on top of that, a color filter and an intermediate transparent film are formed, and then a first microlens is formed thereon. The second microlens located in the lower part is formed using a material having a larger refractive index than that of the intermediate transparent film or the BPSG film.

9 Claims, 9 Drawing Sheets

SOLID-STATE IMAGING DEVICE AND METHOD OF MANUFACTURING THE SAME

This a Divisional of application Ser. No. 08/522,131, filed Aug. 31, 1995, which application(s) are incorporated herein by reference, now U.S. Pat. No. 5,796,154.

FIELD OF THE INVENTION

This invention relates to a solid-state imaging device (hereinafter referred also as charge coupled device (CCD)) and a method of manufacturing the same.

BACKGROUND OF THE INVENTION

Recently, the coloring method for a solid-state imaging device in primary use comprises an on-chip color filter structure, in which a color filter layer is formed directly on the surface of a semiconductor substrate provided with a solid-state imaging element. This method has taken the place of a filter adhesion system, in which a glass plate on which is disposed a color filter layer is adhered on a solid-state imaging element. Furthermore, a compact-size solid-state imaging device has a microlens formed on top of the color filter layer to converge incident light to a photodiode part for improving photosensitivity.

In the following, a conventional solid-state imaging device will be explained.

FIG. 5 is a cross-sectional view showing an image pick-up part of a conventional solid-state imaging device. In FIG. 5, reference numeral 13 represents a n-type semiconductor substrate provided with a solid-state imaging element; 12 represents a p-well layer; 11 represents a photodiode part; 10 represents a charge transfer part; 9 represents a silicon oxide or nitride film; 8 represents a polysilicon electrode; 14 represents a photo-shielding metal layer; 5 represents a surface protective coating of a semiconductor element; 19 represents a planarization layer for flattening an element; 4 represents a color filter layer; 3 represents an intermediate transparent film; and 1 represents a microlens. Furthermore, another conventional example comprises one additional layer of metal film formed via a silicon oxide film on the photo-shielding metal layer 14 for strengthening the photo-shielding and forming a semiconductor element with the surface protective coating 5. In this way, the microlens 1 is adjusted and positioned to each photodiode part, and light converged by the lens is directed to the photodiode part 11 to enhance sensitivity. Among electrons and holes arising from photoenergy in the photodiode part 11, the electrons are forwarded to the charge transfer part 10 by voltage applied to the polysilicon electrode 8. The transferred electrons are then forwarded to an output part by potential energy created in the charge transfer part 10 through the voltage applied to the polysilicone electrode 8.

Another example, which is disclosed in Laid-open Japanese patent application No. (Tokkai Hei) 5-134111, is an invention which controls an optical path by forming the intermediate film 3 disposed under the microlens 1 using a material such as polyimide whose refractive index is larger than the refractive index of the microlens.

Also, the color filter 4 is not used in a three chips imaging device for video cameras or in a black-and-white CCD.

However, the above-mentioned conventional configuration had the problems as follows, which resulted in difficulty in improving sensitivity.

In general, a solid-state imaging device is placed where light is converged by an optical lens and an image is formed.

In this case, the incident angle varies according to a diaphragm size of an opening part. In particular, when a diaphragm is in an open state, as shown in FIG. 4, the optical path of a light beam 18 entering obliquely does not reach a photodiode part 11, but instead is directed to a photo-shielding film 7. As a result, the sensitivity does not improve as expected when the diaphragm of an optical lens is open.

Furthermore, in order to direct as many oblique photo-components to a photodiode part as possible, it is known to shorten the distance from the microlens 1 to the photodiode part 11 (hereinafter abbreviated as a photodiode part distance). In the conventional system, however, aluminum is used for the photo-shielding film 14, and since this photo-shielding film 14 is shared also as surrounding wirings, a thickness close to 1 μm is needed. In addition, a stepwise difference at the opening part becomes large, so that it is necessary to form the planarization layer 19 sufficiently in order to form the color filter and the microlens uniformly. Also, another example of the solid-state imaging device which applies the method of forming two stages of photo-shielding layers cannot shorten the photodiode part distance due to the same reason mentioned above.

In addition, the Laid-open Japanese patent application No. 5-134111 proposed to provide a lens effect exceeding the refractive index 1.56 of the microlens, but as the refractive index increases, the light transmittance of the material deteriorates. As a result, the material is colored, which leads to deterioration of the sensitivity.

SUMMARY OF THE INVENTION

It is an object of this invention to solve the above-mentioned problems in the conventional system by providing a solid-state imaging device which prevents the light-gathering rate of oblique incident light from decreasing and possesses high sensitivity and excellent image characteristics. Another object of this invention is to provide a method of manufacturing this solid-state imaging device.

In order to accomplish these and other objects and advantages, a solid-state imaging device of this invention comprises two layers of microlenses positioned on upper and lower sides corresponding to a photodiode part disposed on the surface of a semiconductor substrate having a solid-state imaging element formed thereon, and a semiconductor element surface protective coating is provided above the photodiode part of the solid-state imaging element, and an intermediate film is provided between the two upper and lower microlenses. The upper and lower microlenses have substantially the same photorefractive index and almost equivalent photopermeability. The photorefractive index of the upper and lower microlenses is larger than that of the intermediate film held between the microlenses, and is larger than the average refractive index of the film from the semiconductor element surface protective coating to the photodiode part.

It is preferable in the above-mentioned configuration that the cross-sectional shape of the lower microlens is a convex shape whose central part is swelled either in the upward or downward direction.

Furthermore, it is preferable in the above-mentioned configuration that the cross-sectional shape of the upper microlens is a convex shape whose central part is swelled either in the upward or downward direction.

In addition, it is preferable in the above-mentioned configuration that at least one film selected from the group comprising a metal silicide film and a metal film with a high melting point is formed as a photo-shielding film in a photo-shielding area other than the photodiode part.

Also, it is preferable in the above-mentioned configuration that the metal silicide film is at least one film selected from the group consisting of tungsten silicide (WSi), molybdenum silicide (MoSi), and titanium silicide (TiSi).

It is preferable in the above-mentioned configuration that the metal film with a high melting point comprises at least one metal film selected from the group consisting of tungsten (W), molybdenum (Mo), and titanium (Ti).

Furthermore, it is preferable in the above-mentioned configuration that a Boro-Phospho-Silicate-Glass (BPSG) film is formed as a surface layer of the photo-shielding film and the photodiode part.

In addition, it is preferable in the above-mentioned configuration that a cross section of the Boro-Phospho-Silicate-Glass (BPSG) film is formed in a hollow shape.

Also, it is preferable in the above-mentioned configuration that the BPSG film has a thickness of from 0.5 $\mu$m to 1.2 $\mu$m.

It is preferable in the above-mentioned configuration that the semiconductor element surface protective coating comprises at least one film selected from the group consisting of $SiO_2$, SiON, and SiN.

Furthermore, it is preferable in the above-mentioned configuration that a color filter layer is formed between the upper and lower microlenses and contacting the upper side of the lower microlens.

Next, a method of manufacturing a solid-state imaging device of this invention, the solid-state imaging device comprising two layers of microlenses positioned on upper and lower sides corresponding to a photodiode part disposed on the surface of a semiconductor substrate having a solid-state imaging element formed thereon, comprises the steps of:

(A) forming at least one surface protective coating selected from the group comprising $SiO_2$, SiON, and SiN above the photodiode part, for example, by a molecular deposition method using plasma;

(B) coating a second microlens material resin on top of the surface protective coating, heating and softening, and hardening to form a second microlens;

(C) coating a resin material having a lower refractive index than the second microlens material resin, flattening, and forming an intermediate film; and (D) coating a first microlens material resin which has the same refractive index and at least substantially equivalent photopermeability as the second microlens material resin, heating and softening, and hardening to form a first microlens;

(E) wherein the photorefractive index of the upper and lower microlenses is larger than the average refractive index of the film from the surface protective coating to the photodiode part.

It is preferable in the above-mentioned configuration that the cross-sectional shape of the lower microlens is a convex shape whose central part is swelled either in the upward or downward direction.

Furthermore, it is preferable in the above-mentioned configuration that the cross-sectional shape of the upper microlens is a convex shape whose central part is swelled either in the upward or downward direction.

In addition, it is preferable in the above-mentioned configuration that at least one film selected from the group consisting of a metal silicide film and a metal film with a high melting point is formed as a photo-shielding film in a photo-shielding area other than the photodiode part by a sputtering or a CVD (chemical vapor deposition) method. In this way, a photo-shielding film which is thin and has a uniform thickness can be obtained.

Also, it is preferable in the above-mentioned configuration that the metal silicide film is at least one film selected from the group consisting of tungsten silicide (WSi), molybdenum silicide (MoSi), and titanium silicide (TiSi).

It is preferable in the above-mentioned configuration that the metal film with a high melting point comprises at least one metal film selected from the group consisting of tungsten (W), molybdenum (Mo), and titanium (Ti).

Furthermore, it is preferable in the above-mentioned configuration that a Boro-Phospho-Silicate-Glass (BPSG) film is formed as a surface layer of the photo-shielding film and the photodiode part by the CVD method.

In addition, it is preferable in the above-mentioned configuration that the cross section of the Boro-Phospho-Silicate-Glass (BPSG) film is formed in a hollow shape.

Also, it is preferable in the above-mentioned configuration that the Boro-Phospho-Silicate-Glass (BPSG) film has a thickness of from 0.5 $\mu$m to 1.2 $\mu$m.

It is preferable in the above-mentioned configuration that a color filter layer is formed between the upper and lower microlenses and contacting the upper side of the lower microlens.

According to the above-mentioned configuration of this invention, a solid-state imaging device comprises two layers of microlenses positioned on upper and lower sides corresponding to a photodiode part disposed on the surface of a semiconductor substrate having a solid-state imaging element formed thereon, and a semiconductor element surface protective coating is provided above the photodiode part of the solid-state imaging element, and an intermediate film is provided between the two upper and lower microlenses. The upper and lower microlenses have substantially the same photorefractive index and almost equivalent photopermeability. The photorefractive index of the upper and lower microlenses is larger than that of the intermediate film held between the microlenses, and is larger than the average refractive index of the film from the semiconductor element surface protective coating to the photodiode part. As a result, a solid-state imaging device which prevents a light-gathering rate of oblique incident light from decreasing and possesses high sensitivity and excellent image characteristics can be attained. In other words, when light enters the solid-state imaging device obliquely, the light with an optical path which misses the photodiode part is gathered by the second microlens located in the lower part to form the light more vertically, thereby preventing the sensitivity from deteriorating. Furthermore, since the material used is the same as the microlens material or has equivalent permeability with the microlens material, deterioration of sensitivity due to absorption of light does not occur.

As mentioned above, it is preferable that the cross-sectional shape of the lower microlens is a convex shape whose central part is swelled in the upward and downward direction. As a result, according to the so-called principle of convex lens, light entering from above can be gathered effectively and led to the central position of the light-intercepting part, thereby maintaining the sensitivity to a high degree.

Furthermore, as mentioned above, it is preferable that the shape of the upper microlens is a convex shape whose central part is swelled either in the upward direction. According to the above-mentioned so-called principle of convex lens, light entering from above can be gathered effectively and led to the central position of the photodiode part, thereby maintaining the sensitivity to a high degree.

In addition, when at least one film which is selected from the group consisting of a metal silicide film and a metal film with a high melting point is formed as a photo-shielding film in a photo-shielding area other than the photodiode part, a polysilicone electrode can be formed thinner than when using a conventional metal aluminum film as a photo-shielding film. At the same time, the photo-shielding film and the polysilicone electrode form a convex shape so that the photodiode part formed between the polysilicon electrode and the adjacent electrode forms a concave shape. Through the BPSG film formed thereon, the shape of the second microlens is determined. In other words, the thickness of the final BPSG film determines the shape of the lens, but its basic shape is determined by the thicknesses and widths of the polysilicone electrode and the photo-shielding film and the distance therebetween. For example, supposing that the thickness of the polysilicone electrode is about 0.8 to 1 $\mu$m, the distance between the polysilicone electrode and the adjacent polysilicone electrode (the photodiode part) is about 5 $\mu$m, the thickness of the photo-shielding film on the surface of the polysilicone electrode is about 0.4 $\mu$m, and the thickness of the BPSG film is about 0.8 $\mu$m, then the shape of the second microlens comprises a convex lens whose central part is formed in a convex shape.

Also, it is even more effective to select the metal silicide film at least from the group comprising tungsten silicide (WSi), molybdenum silicide (MoSi), and titanium silicide (TiSi). In the above-mentioned configuration, the metal film with a high melting point may comprise at least one metal film selected from the group consisting of tungsten (W), molybdenum (Mo), and titanium (Ti).

Furthermore, it is preferable in the above-mentioned configuration that a Boro-Phospho-Silicate-Glass (BPSG) film is formed as a surface layer of the photo-shielding film and the photodiode part. In this way, the surface shape becomes smoother by heating, compared with usual phosphorus glass (PSG) or nitride glass (NSG).

In addition, since the cross section of the Boro-Phospho-Silicate-Glass (BPSG) film in the area of the photodiode part is formed by the polysilicone electrode and the photo-shielding film to cover the adjacent convex shape entirely, a hollow shape with a smooth surface can be accomplished. Namely, the top part of the photodiode part takes a hollow and smooth cross-sectional form, and this shape can determine the shape of the second microlens. Also, when a deep shape is formed, it is preferable to deposit a thin BPSG film, and when a shallow shape is formed, a thick BPSG film should be deposited. It is preferable in the above-mentioned configuration that the BPSG film has a thickness of from 0.5 $\mu$m to 1.2 $\mu$m.

As mentioned above, the semiconductor element surface protective coating comprises at least one film selected from the group consisting of $SiO_2$, SiON, and SiN. These materials are generally used for passivation (surface protection) of a semiconductor, and they can prevent surface dust from contaminating the inside of the element or moisture from permeating.

Furthermore, when a color filter layer is formed between the upper and lower microlenses and contacting the upper side of the lower microlens, an excellent color CCD can be attained.

Next, according to the method of manufacturing a solid-state imaging device of this invention, the solid-state imaging device comprising two layers of microlenses positioned on upper and lower sides corresponding to a photodiode part disposed on the surface of a semiconductor substrate having a solid-state imaging element formed thereon, the method comprises the steps of:

(A) forming at least one surface protective coating selected from the group consisting of $SiO_2$, SiON, and SiN above the photodiode part, for example, by a molecular deposition method using plasma;

(B) coating a second microlens material resin on top of the surface protective coating, heating and softening, and hardening to form a second microlens;

(C) coating a resin material having a lower refractive index than the second microlens material resin, flattening, and forming an intermediate film; and (D) coating a first microlens material resin which has the same refractive index and at least substantially equivalent photopermeability as the second microlens material resin, heating and softening, and hardening to form a first microlens;

(E) wherein the photorefractive index of the upper and lower microlenses is larger than the average refractive index of the film from the surface protective coating to the photodiode part.

As a result, the solid-state imaging device of this invention can be manufactured efficiently.

DETAILED DESCRIPTION OF THE INVENTION

This invention will now be explained in detail with reference to the attached figures and the following examples. The examples are illustrative and should not be construed as limiting the invention in any way.

Figure 1:
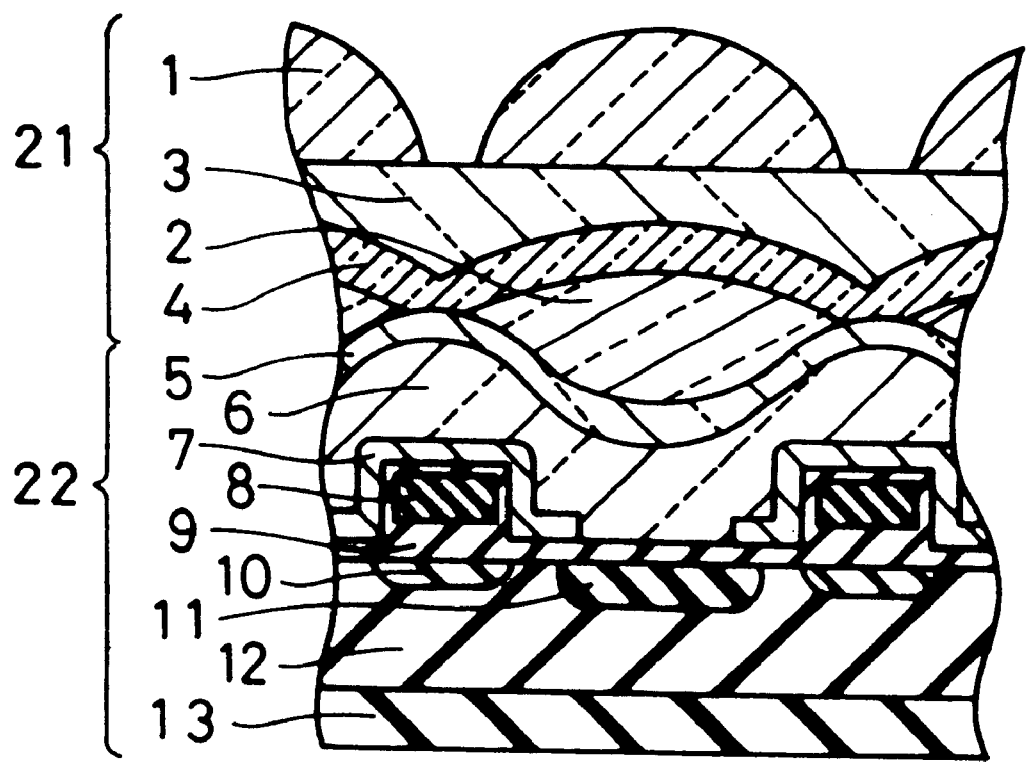
FIG. 1 is a cross-sectional view showing an image pick-up part of a solid-state imaging device in one embodiment of this invention.
Figure 2:
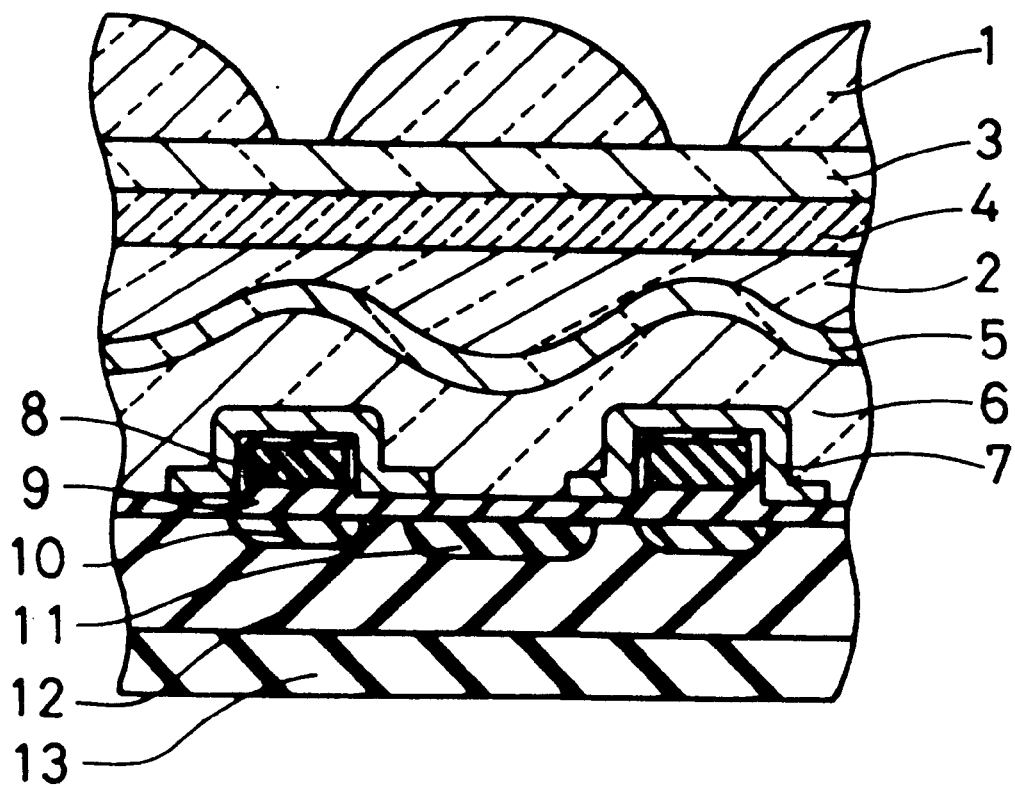
FIG. 2 is a cross-sectional view showing an image pick-up part of a solid-state imaging device in a second embodiment of this invention.

FIG. 1 is a cross-sectional view showing an image pick-up part of a solid-state imaging device in Example 1 of this invention. This first example shows an on-chip filter having two layers of microlens disposed on the upper and lower sides and a structure of a semiconductor element placed under the on-chip filter. FIG. 2 is a cross-sectional view showing an image pick-up part of a solid-state imaging device in a second embodiment of this invention. This second example has two layers of microlenses formed through coating, heating, and melting. In the following figures of FIG. 1 to FIG. 3 and FIG. 6 to FIG. 9, the same parts are provided with the same reference numerals, and the explanation thereto is omitted.

EXAMPLE 1

In the first embodiment shown in FIG. 1, a p-well layer 12 about 3 µm thick was formed on the surface of a n-type semiconductor substrate 13 using an impurity injection method or a drive-in furnace after injecting impurity. On the surface part of the p-well layer 12, the impurity injection method was used to form an electrode transfer part 10 with each side about 1 µm long and a thickness of about 0.3 µm and a photodiode part 11 with each side about 1.5 µm long and a thickness of about 1 µm. Next, a method of forming a nitride film by pyrooxide low-pressure CVD (chemical vapor deposition) was used to form an ONO film 9 comprising a silicon oxide film of about 0.1 µm thick incorporated with a silicon nitride film (SiN). Subsequently, using a low-pressure CVD method, a polysilicone electrode 8 with each side about 1 µm long and a thickness of about 0.4 µm was formed.

On top of the polysilicone electrode 8, tungsten (W) or tungsten silicide (WSi) was deposited as a photo-shielding film 7 with a thickness of from 100 nm to 500 nm, and only the part over the photodiode part 11 was removed by etching. In this embodiment, the sputtering method or the CVD method was used to form a WSi film 0.4 µm thick.

On the surface of the photo-shielding film 7, a BPSG film 6 was deposited. BPSG has a boron concentration of 3 weight % and a phosphorus concentration of 6 weight %, and the film was deposited at a thickness of from 0.4 to 1.2 µm. In this embodiment, a normal-pressure CVD method was used to form a thickness of 0.8 µm. The refractive index of BPSG is about 1.47. In this case, the part over the photodiode part 11 had a hollow cross-sectional shape. A deeper shape can be formed by forming the BPSG film thinner, and a shallower shape can be formed by depositing a thicker film. This shape determines the shape of a second microlens 2. Furthermore, as an element surface protective coating 5, SiO$_2$, SiON, or SiN was deposited by plasma CVD (SiO$_2$ was used in this embodiment). The thickness is about 400 nm, and the refractive index is about 1.50 to 1.55. The section ranging from the n-type semiconductor substrate 13 to the element surface protective coating 5 is generally referred to as a semiconductor imaging element part 22.

On the surface of the element surface protective coating 5, a material 2' of the second microlens 2 was coated by a rotary-coating (spin-coating) method. The material comprises a polypara-vinyl-phenol-based resin shown in the formula below (Formula 1), which is characterized by melting when heated and hardening when heated further.

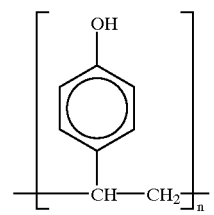

(Formula 1)

(In this formula, n represents the polymerization number, indicating the number of repetitive units of the polymer.)

Figure 6A:
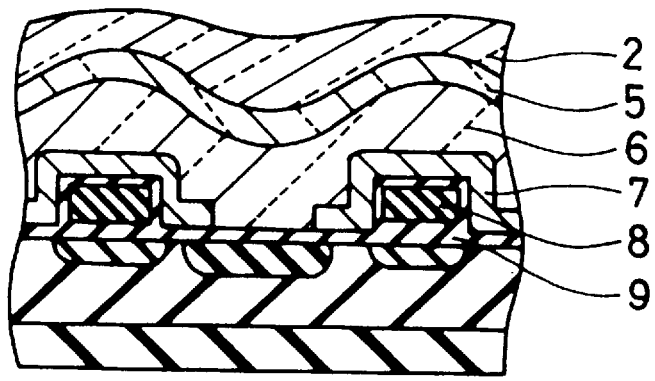
FIGS. 6(a) to 6(c) are cross-sectional views showing a method of manufacturing a second microlens in one embodiment of this invention.
Figure 6B:
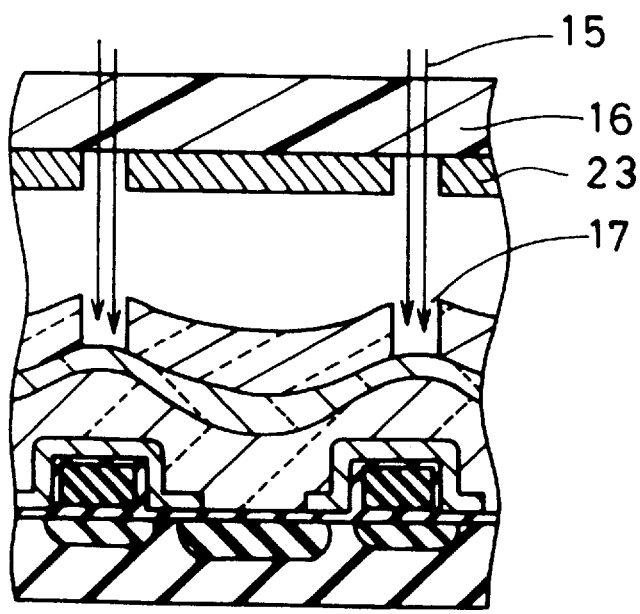
Figure 6C:
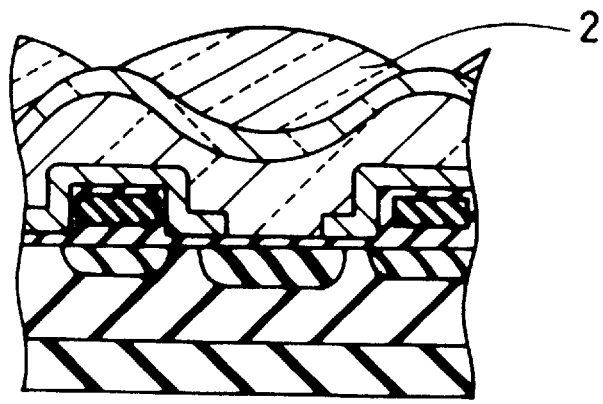

A naphthoquinone diazide photosensitive agent is added to the above-mentioned polypara-vinyl-phenol-based resin, and patterning can be performed with ultraviolet rays. FIG. 6(a) is a cross-sectional view showing the coated condition. Ultraviolet rays 15 are irradiated through a reticule 16 (This reticule is formed of a transparent synthetic quartz, and a mask 23 of metal patterns made of chrome is integrated. This reticule is a projection reticule for ⅕ reduction. The window part of the mask 23 has a size of 25 µm in length×20 µm in width, and the thickness of the chrome patterns is 0.1 µm.), which is designed in a size for forming the second microlens, and a part where the microlens material is removed was sensitized. Next, an organic alkali solution (a non-metal-type organic ammonium developing solution which is used generally in this field) was used for rinsing, and a development patterning 17 was formed in the exposure part. A cross-sectional view of this condition is shown in FIG. 6(b). Furthermore, ultraviolet rays were irradiated to enhance the permeability of the lens material to about 90 to 98%. After a heat treatment was performed for 5 minutes at about 150 to 180° C., it was heated further for 5 minutes at 200° C. to ensure hardening through melting. As a result, the second microlens 2 was formed. The cross-sectional view of the second microlens 2 is shown in FIG. 6(c). The second microlens 2 had a diameter of 9 µm and a maximum thickness of 2.2 µm. This second microlens 2 had a refractive index n$_2$ of 1.560.

When a resin made of the same based material comprising a transparent resin without photosensitivity was used which hardens after being softened at 150° C., a novolak-type photosensitive resist (TSMR-8900 manufactured by TDK Co., Ltd.) was coated on this resin and subjected to patterning. Thereafter, parts other than the final lens shape were removed by dry or wet etching. The foundation comprised an inorganic SiO-type substance, so that an etching rate difference with an organic resin could be ensured large enough, which enabled a sure pattern formation.

The novolak-type resist was washed selectively in a release solution and removed. After washing the resist in pure water and drying, the second microlens material was melted at 150° C., and then heated to 200° C. for hardening. As a result, the structure shown in a cross-sectional view of FIG. 6(c) was formed. The second microlens had a diameter of 9 µm and a maximum thickness of 2 µm.

After the second microlens was formed, a color filter material was coated. The color filter comprised a negative-type photosensitive acrylic-based dyed material 4 (FIG. 1) which was rotary-coated to form a thickness of 0.3 to 0.9 µm. In order to leave a pixel part to be dyed with the same color, the color filter was cross-linked by exposure of ultraviolet rays and hardened for 5 minutes at 130° C. Thereafter, it was dipped in a predetermined stain solution and dyed. This dying process was performed by using a method which is well-known in this field. The refractive index $n_4$ of the color filter was 1.55, which was almost equal to the refractive index of the second microlens, and the optical path was the same as that of the microlens. Next, an intermediate film 3 comprising a transparent acrylic resin was rotary-coated to form a thickness of 0.9 μm and then flattened.

The refractive index $n_3$ of the intermediate film was about 1.498 and was smaller than the refractive index $n_2$ of the second microlens. In this way, the second microlens of a convex shape could now gather light in the upper direction. Furthermore, when a black-and-white imaging or a three chips imaging device for video cameras is used, the color filter is not necessary. The intermediate layer 3 was rotary-coated directly. Next, the material of the first microlens was coated, and ultraviolet rays were provided for exposure through a reticule (mask) following the shape of the microlens. Since the microlens comprised a photosensitive material, an organic alkali solution (non-metal-type organic ammonium developing solution) was used for developing and removing unnecessary parts. In addition, ultraviolet rays were irradiated to make the material transparent, and the substance was heated for 5 minutes at the temperature of 130 to 160° C., and melted and hardened. Thereafter, the substance was heated again for 5 minutes at 200° C, for improving the reliability. As a result, the first microlens 1 shown in FIG. 1 was formed. The refractive index $n_1$ of this first microlens 1 was 1.560. Furthermore, a refractive index of the intermediate film 3 held between the above-mentioned microlenses 1 and 2 was 1.495. Also, the film ranging from the BPSG film 6 to the photodiode part 11 had an average refractive index of 1.470, which is almost the same as that of the BPSG film 6. The above-mentioned section ranging from the first microlens 1 to the second microlens 2 is generally referred to as an on-chip microlens part 21.

Figure 3:
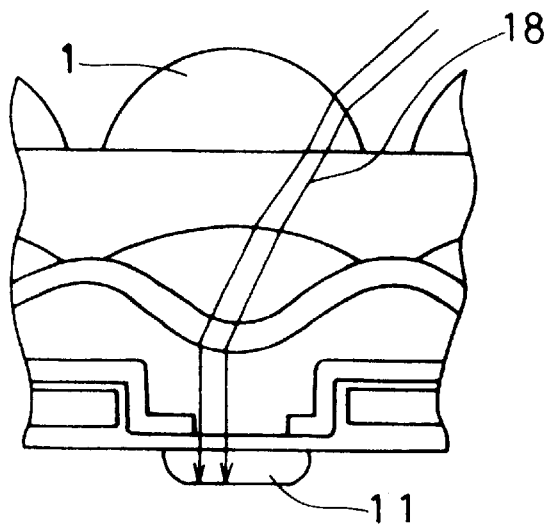
FIG. 3 is a schematic view showing the process of gathering oblique light by a second microlens and leading it to a photodiode part in one embodiment of this invention.
Figure 4:
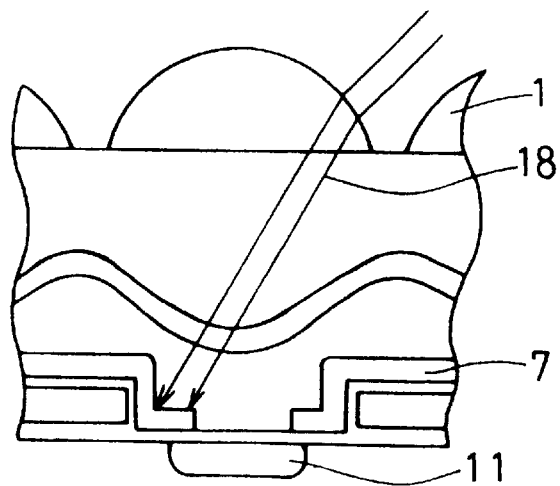
FIG. 4 is a schematic view showing a state in which an optical part of oblique light misses a photodiode part in a conventional example.
Figure 5:
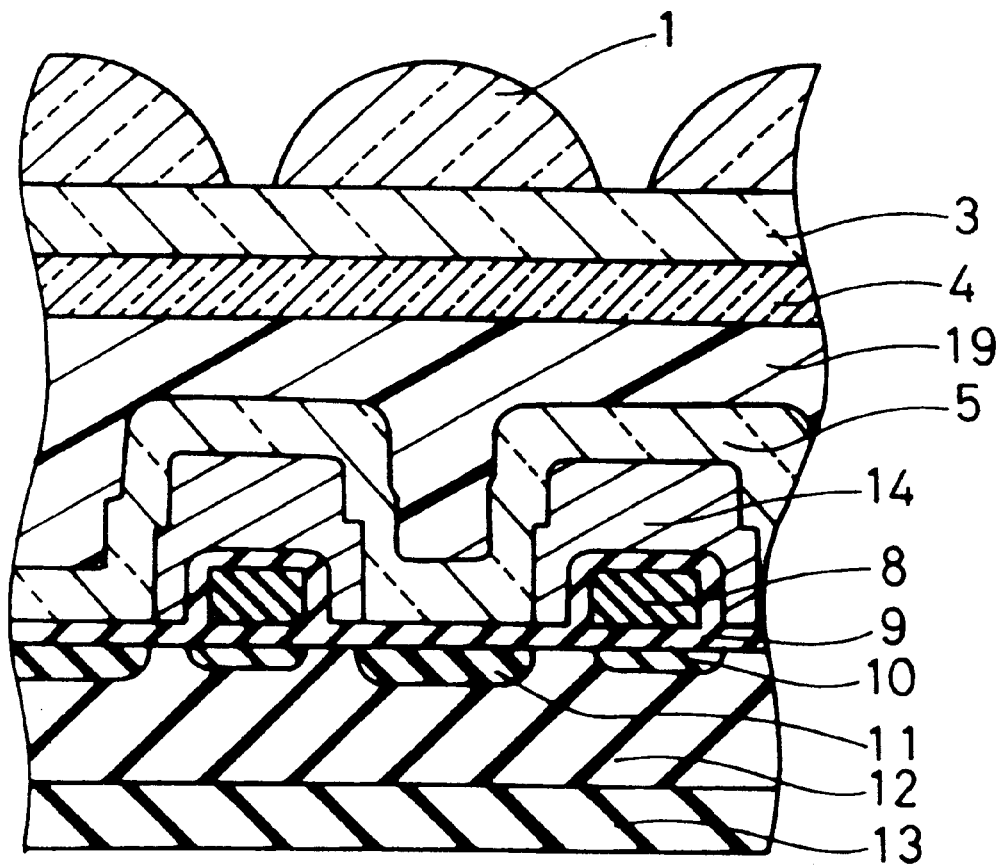
FIG. 5 is a cross-sectional view showing an image pick-up part of a conventional solid-state imaging device.

Accordingly, under the conditions in which an optical lens had an open diaphragm of FIG. 4 and oblique incident photocomponents are present, the solid-state imaging device (CCD) provided with the second microlens in the lower position provided output sensitivity which is increased by +10 to +15%, compared with a conventional method (only the first lens is present). Furthermore, it was confirmed that undesirable stray light components (smear) of images could be reduced by about 30%. As shown in FIG. 3, the optical path of the oblique incident light 18 reaches the photodiode part 11 in full in the condition when the diaphragm is open. As a result, the sensitivity improves when the diaphragm of the optical lens is open.

As clearly shown in the above-mentioned embodiment, it was confirmed that the solid-state imaging device having high sensitivity can be attained when the light enters the solid-state imaging device obliquely, in which the light with an optical path which would miss the photodiode part is gathered by the second microlens in the lower part to direct the light more vertically. Furthermore, it was also confirmed that the use of a material which is the same as the microlens material and having equivalent permeability with the microlens material prevents deterioration of sensitivity due to absorption of light from occurring.

Example 2

In a second embodiment of this invention, the steps up to the coating of the second microlens material 2' on top of the surface protective coating 5 are the same as those in Example 1 (FIG. 6(a)). Thereafter, instead of patterning, a method of melting and hardening directly was applied. FIG. 2 shows its cross-sectional configuration. After the coating, ultraviolet rays were irradiated to make the material transparent. The substance was heated for 5 minutes at the temperature of 190 to 200° C., which is a melting temperature, and liquidized once and flattened. By further continuing the heating, the substance hardened. In Example 1, the second microlens separated respectively and showed a convex shape in the upward and downward directions, whereas a convex shape was formed only in the down direction in Example 2. A diameter of the second microlens was about 10 μm, and the maximum thickness in the central part was about 1.7 to 1.8 μm.

In both of the Examples, the refractive index $n_2$ of the second microlens was larger than the refractive index $n_6$=1.47 of BPSG ($n_2 > n_6$) and the same as the refractive index $n_5$=1.560 of the element surface protective coating 5. The refractive index $n_2$ of this second microlens was 1.560.

Next, after the second microlens was formed, a color filter material was coated as in Example 1. The refractive index $n_4$ of the color filter, which was 1.55, was almost equal to the refractive index of the second microlens, and an optical path was equal to the microlens. Thereafter, the intermediate film 3 was formed by rotary-coating, and a flattened material was formed by coating. The intermediate film was also formed in the same manner as in Example 1.

The refractive index $n_3$ of the intermediate film was about 1.49 and was smaller than the refractive index $n_2$ of the second microlens. In this way, the second microlens of an upright convex shape could now gather light. Furthermore, when a black-and-white imaging or a three chips imaging device for video cameras was used, the color filter was not necessary, and the intermediate layer 3 was rotary-coated directly. After the material of the first microlens was coated, ultraviolet rays were provided for exposure through a reticule (mask) following the shape of the microlens. Since the microlens comprises a photosensitive material, an organic alkali solution (non-metal-type organic ammonium developing solution) was used for developing and removing unnecessary parts. In addition, ultraviolet rays are irradiated to make the material transparent, and the substance was heated for 5 minutes at the temperature of 130 to 160° C., and melted and hardened. Thereafter, the substance was heated again for 5 minutes at 200° C. for improving the reliability. As a result, the first microlens 1 shown in FIG. 2 was formed. The refractive index $n_1$ of this first microlens 1 was 1.560. Furthermore, the refractive index of the intermediate film 3 held between the above-mentioned microlenses 1 and 2 was 1.495. Also, the film ranging from the BPSG film 6 to the photodiode part 11 had an average refractive index of 1.470, which was the same as that of the BPSG film 6.

Accordingly, under the conditions in which an optical lens had an open diaphragm of FIG. 4 and oblique incident photocomponents are present, the solid-state imaging device (CCD) provided with the second microlens in the lower part provided output sensitivity which is increased by +5 to +10%, compared with a conventional method (only the first lens is present). Furthermore, it was confirmed that undesirable stray light components (smear) of images could be reduced by about 20%. As shown in FIG. 3, the optical path of the oblique incident light 18 reaches the photodiode part 11 in full in the condition when the diaphragm is open. As a result, the sensitivity improves when the diaphragm of the optical lens is open.

As clearly shown in the above-mentioned embodiment, it was confirmed that the solid-state imaging device having high sensitivity can be attained when the light enters the solid-state imaging device obliquely, in which the light with an optical path which misses the photodiode part is gathered by the second microlens in the lower part to direct the light more vertically. Furthermore, it was also confirmed that the use of a material which is the same with the microlens material and the material having the equivalent permeability with the microlens material prevents deterioration of sensitivity due to absorption of light from occurring.

Examplee 3

A method of manufacturing a solid-state imaging device in an embodiment of this invention will be explained by referring to FIGS. 6(a) to 6(c).

FIG. 6(a) is cross-sectional view showing a step of coating polypara-vinyl-phenol shown in the above-mentioned formula (Formula 1) with a thickness of 2 $\mu$m after a semiconductor imaging element is completed according to this manufacturing method. FIG. 6(b) is a cross-sectional view showing an intermediate step of developing with an organic ammonia after ultraviolet rays 15 are irradiated through a reticule (mask) 16, in which the material 2' of the second microlens in this manufacturing method comprises a positive-type photosensitive material. FIG. 6(c) is a cross-sectional view showing an intermediate step in this manufacturing method comprising heating at 150 to 180° C., melting, and hardening after attaining tranparency by irradiating the ultraviolet rays.

Subsequently, a negative-type photosensitive acrylic-based dyed material 4 (FIG. 1) is rotary-coated to form a thickness of 0.3 to 0.9 $\mu$m, and in order to leave a pixel part to be dyed with the same color, cross-linking was allowed to take place by exposure of ultraviolet rays, and it was hardened for 5 minutes at 130° C. Thereafter, it was dipped in a predetermined stain solution and dyed. This dying process was performed by using a method which is well-known in this field. A refractive index $n_4$ of the color filter was 1.55, which was almost equal to the refractive index of the second microlens, and the optical path was the same as that of the microlens. Next, the intermediate film 3 was rotary-coated to form a thickness of 0.9 $\mu$m and then flattened. Thereafter, the first microlens 1 was coated with a thickness of about 2 $\mu$m, and ultraviolet rays were provided for exposure through a reticule (mask). After the exposed part was washed with an organic alkali solution (non-metal-type organic ammonium developing solution), ultraviolet rays are irradiated to make the material transparent, and the substance was heated for 5 minutes at the temperature of 130 to 160° C., and melted and hardened. Thereafter, the substance was heat ed again for 5 minutes at 200° C. for improving the reliability, thereby forming the second microlens. The refractive index $n_2$ of this second microlens was 1.560. The refractive index $n_1$ of the first microlens was also 1.560. The refractive index $n_3$ of the intermediate film 3 was about 1.495 and was smaller than the refractive index $n_2$ of the second microlens. In this way, the second microlens of an upright convex shape could now gather light. In addition, the film ranging from the BPSG film 6 to the photodiode part 11 had an average refractive index of 1.470, which is almost the same with that of the BPSG film 6.

Accordingly, under the conditions in which an optical lens had an open diaphragm of F1.4 and oblique incident photocomponents are contained, the solid-state imaging device (CCD) provided with the second microlens in the lower part proved to output sensitivity which is increased at +10 to +15% compared with a conventional method (only the first lens is present). Furthermore, it was confirmed that undesirable stray light components (smear) of images could be reduced at about 30%. As shown in FIG. 3, the optical path of the oblique incident light 18 reaches the photodiode part 11 in full in the condition when the diaphragm is open. As a result, the sensitivity improves when the diaphragm of the optical lens is open.

As clearly shown in the above-mentioned embodiment, it was confirmed that the solid-state imaging device having high sensitivity can be attained when the light enters the solid-state imaging device obliquely, in which the light with an optical path which would miss the photodiode part is gathered by the second microlens in the lower part to direct the light more vertically. Furthermore, it was also confirmed that the use of a material which is the same as the microlens material and having equivalent permeability with the microlens material prevents deterioration of sensitivity due to absorption of light from occurring. Also, it was confirmed that undesirable stray light components (smear) of images could be reduced simultaneously.

Example 4

Figure 10:
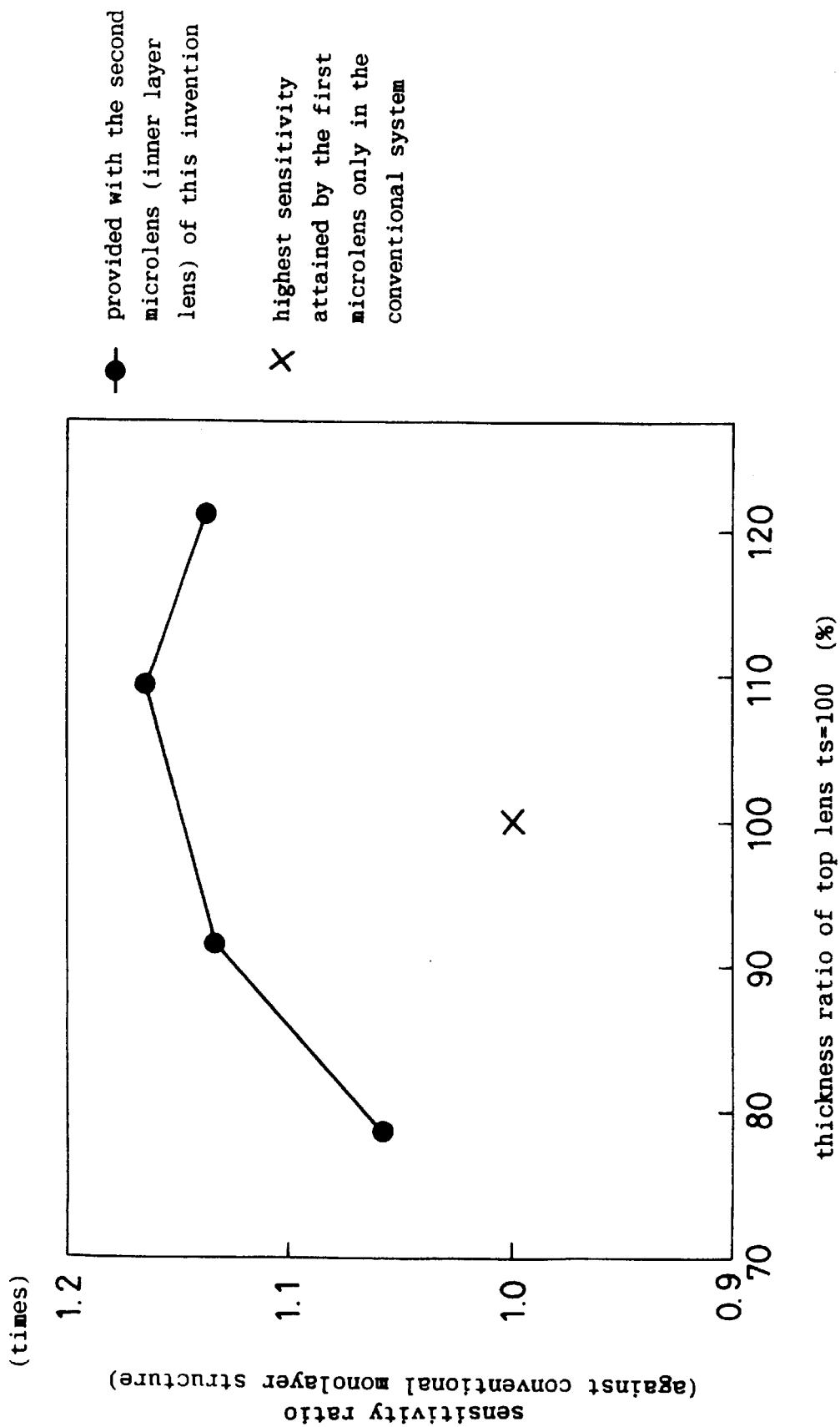
FIG. 10 is a graph showing a sensitivity ratio compared between a fourth embodiment of this invention and a conventional example.

Next, sensitivity ratios of incident light are compared between a conventional solid-state imaging apparatus in which a second microlens is not present (FIG. 7) and a solid-state imaging apparatus in which a second microlens manufactured in the same manner as in Example 3 (FIG. 8) is present. The results are shown in FIG. 10. In FIG. 10, the line with marks of black dots shows the sensitivity ratio of incident light in a solid-state imaging apparatus of this embodiment which has the second microlens (inner layer lens). The mark X shows the highest sensitivity standard (=1) of the incident light attained by a conventional solid-state imaging apparatus in which the second microlens is not present. Compared with the above-mentioned conventional solid-state imaging apparatus, it was confirmed that the sensitivity ratio of this embodiment improved by 6~16% while the thickness ratio of the first microlens ranged from 80~120 (%).

Figure 7:
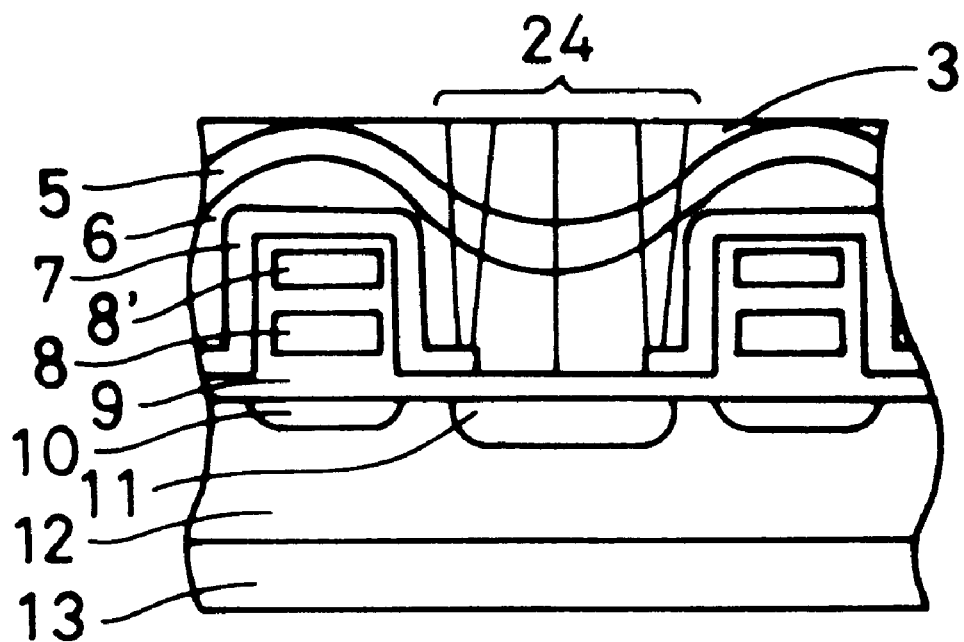
FIG. 7 is a cross-sectional view showing a light course of incident light in a conventional solid-state imaging device in which a second microlens is not present.

According to the above-mentioned results, although incident light 24 (simulated incident light) in the solid-state imaging apparatus which is not provided with the second microlens of FIG. 7 can be gathered to some degree by the first microlens (not shown in the figure), the light entering through an intermediate transparent film 3 diffuses in the circumference of the photodiode part 11 with the use of monolens. Therefore, sufficient sensitivity cannot be obtained, since the diffused light is consequently interrupted by the photo-shielding film 7.

Figure 8:
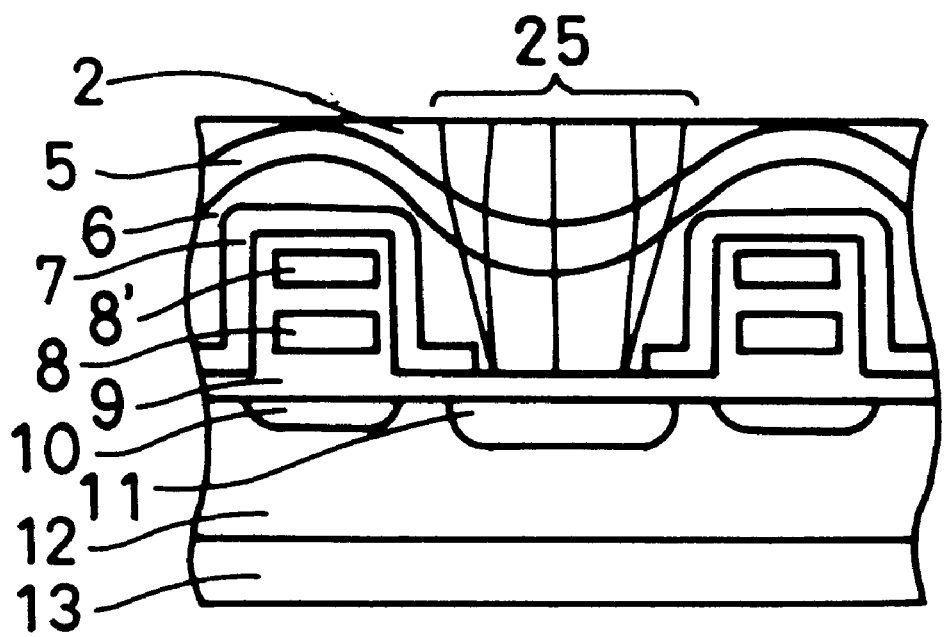
FIG. 8 is a cross-sectional view showing a light course of incident light in a fourth embodiment of this invention.

On the other hand, the solid-state imaging apparatus of this embodiment is provided with the second microlens 2, as shown in FIG. 8, so that incident light 25 (simulated incident light) will now reach the central part of the photodiode part 11 due to the refraction difference between the second microlens 2 and the BPSG film 6. As a result, the sensitivity increases considerably.

Figure 9:
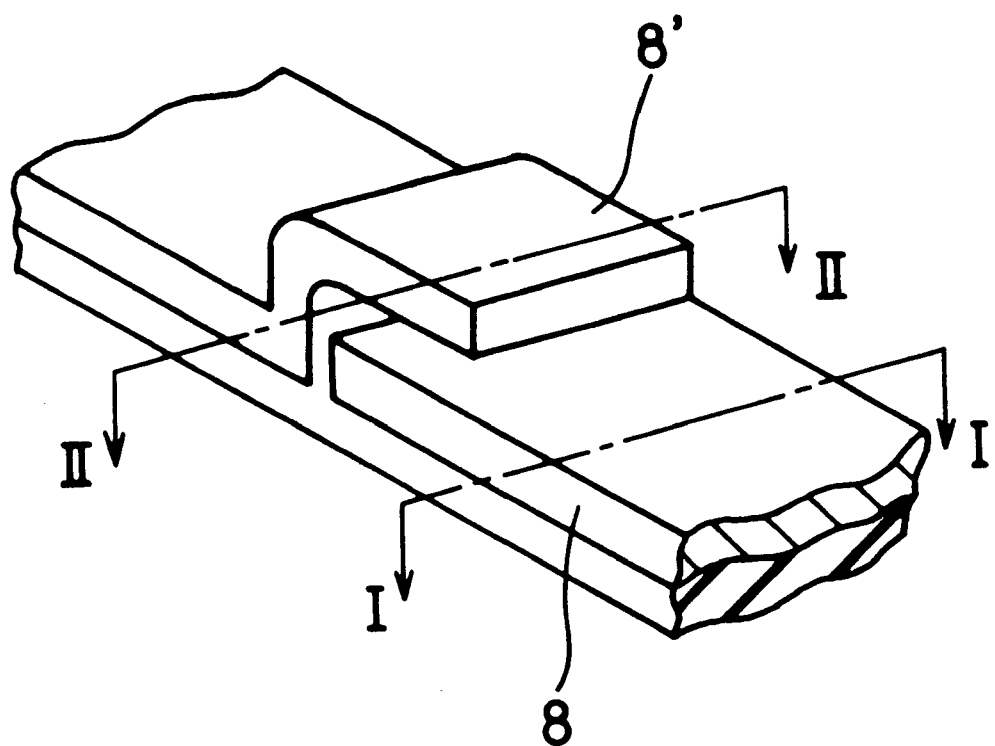
FIG. 9 is a perspective view showing a polysilicon electrode part in one embodiment of this invention.

Furthermore, FIGS. 7~8, in which two electrodes 8, 8' are present in the cross-sectional direction, are cross-sectional views taken on line II—II of FIG. 9. These figures do not differ substantially from FIGS. 1–6 showing cross-sectional views taken on line I—I.

Then, the ratio of sensitivity improvement and the effect in the smear reduction of stray light components (smear) at the time when the sensitivity was at the highest in FIG. 10 are shown in Table 1.

TABLE 1

| | conventional monolens | a thin film inner layer lens |
|---|---|---|
| sensitivity ratio | 1.00: standard | 1.16 |
| smear ratio | 1.00: standard | 0.70 |

When the light which reaches the photodiode part 11 and the photo-shielding film 7 should be strong, the light is reflected on the back side of the photo-shielding film 7 and on the surface of the p-well silicon 12 repetitively and reaches the CCD charge transfer part 10 due to the waveguide effect, which then becomes smear. In addition, the oblique light enters from the edge of the photo-shielding film 7 directly into the CCD charge transfer part 10, so that the smear components increase. However, as clearly shown in Table 1, by forming the second microlens of this invention, the incident light is gathered to the central part of the photodiode part 11, and the concentration of the light toward the photodiode part and the edge part of the photo-shielding film becomes lower, so that the smear components are reduced. The increase in sensitivity together with the reduction of circumferential light density enabled effecting improvement by about 30% compared with the conventional configuration. Thus, it was confirmed by this invention that the sensitivity could be improved and the smear components could be reduced at the same time.

As described above, a solid-state imaging device in these embodiments is formed by using a metal with a high melting point or a metal silicide film thereof as a photo-shielding film, and after the photo-shielding film is thinned, a BPSG film is covered entirely. Then, a microlens is formed directly on an element which is provided with a surface protective coating of $SiO_2$, SiON, or SiN. After a color filter and an intermediate film are coated and flattened, a further microlens is formed, thereby forming two lenses in the upper and lower parts. At least the lower microlens has a refractive index which is larger than the refractive index of the intermediate film or the BPSG, so that when the light enters the solid-state imaging device obliquely, the light with an optical path which would miss the photodiode part is gathered by the second microlens in the lower part to direct the light more vertically. In this way, the solid-state imaging device which can prevent sensitivity from deteriorating can be attained.

Furthermore, by using a material which is the same with a microlens material or that having the equivalent permeability with the microlens material, a solid-state imaging device can be attained in which deterioration of sensitivity due to absorption of light does not occur.

The invention may be embodied in other forms without departing from the spirit or essential characteristics thereof. The embodiments disclosed in this application are to be considered in all respects as illustrative and not as restrictive. The scope of the invention is indicated by the appended claims rather than by the foregoing description, and all changes which come within the meaning and range of equivalency of the claims are intended to be embraced therein.

What is claimed is:

1. A method of manufacturing a solid-state imaging device, the solid-state imaging device comprising a semiconductor substrate, a photodiode part arranged on the semiconductor substrate for receiving incident light to generate a charge, a lower microlens, a flattening film and an upper microlens, wherein the lower microlens, the flattening film, and the upper microlens correspond to the photodiode part and are formed in this order above the photodiode part, the method comprising the steps of:

a) forming a first film on the photodiode part, the first film having a concave surface opposite to the surface facing the semiconductor substrate;

b) forming a lower microlens having a higher refractive index than the first film by coating, heating, softening and hardening a first resin material on the fist film, a surface shape of the lower microlens facing the semiconductor substrate being determined by a surface shape of the first film, the lower microlens having a convex shape of increased thickness at a central part, the central part of the convex shape extending in a direction toward the substrate;

c) forming a flattening film having a lower refractive index that the lower microlens by coating and flattening a second resin material on the lower microlens; and d) forming an upper microlens having substantially the same photopermeability as the lower microlens and substantially the same refractive index as the lower microlens by coating, heating, softening and hardening a third resin material on the flattening film.

2. The method of manufacturing a solid-state imaging device as claimed in claim 1, wherein the shape of the lower microlens is a convex shape with increased thickness at a central part in the upward and downward direction.

3. The method of manufacturing a solid-state imaging device as claimed in claim 1, wherein the shape microlens is a convex shape with increased thickness at a central part in the upward direction.

4. The method of manufacturing a solid-state imaging device as claimed in claim 1, wherein at least one film selected from the group consisting of a metal silicide film and a metal film with a high melting point is formed as a photo-shielding film in an area other than the photodiode part by a sputtering or a CVD method.

5. The method of manufacturing a solid-state imaging device as claimed in claim 4, wherein the metal silicide film is at least one film selected from the group consisting of tungsten silicide (WSi), molybdenum silicide (MoSi), and titanium silicide (TiSi).

6. The method of manufacturing a solid-state imaging device as claimed in claim 4, wherein the metal film with a high melting point comprises at least one metal selected from the group comprising tungsten(W), molybdenuim (Mo), and titanium(Ti).

7. The method of manufacturing a solid-state imaging device as claimed in claim 1, wherein the first film is a Boro-Phospho-Silicate-Glass (BPSG) film.

8. The method of manufacturing a solid-state imaging device as claimed in claim 7, wherein the Boro-Phospho-Silicate-Glass (BPSG) film has a thickness of from $0.5 \mu m$ to $1.2 \mu g\ m$.

9. The method of manufacturing a solid-state imaging device as claimed in claim 1, wherein a color filter layer is formed between the upper and lower microlenses and contacting an upper surface of the lower microlens.

\* \* \* \* \*